(12) United States Patent
Scheuerer et al.

(10) Patent No.: US 8,564,078 B2
(45) Date of Patent: Oct. 22, 2013

(54) METHOD FOR PRODUCING A MICROMECHANICAL COMPONENT HAVING A TRENCH STRUCTURE FOR BACKSIDE CONTACT

(75) Inventors: Roland Scheuerer, Stuttgart (DE); Heribert Weber, Nuertingen (DE); Eckhard Graf, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/291,350

(22) Filed: Nov. 8, 2011

(65) Prior Publication Data

US 2012/0049301 A1 Mar. 1, 2012

Related U.S. Application Data

(62) Division of application No. 12/597,137, filed as application No. PCT/EP2008/054233 on Apr. 8, 2008, now Pat. No. 8,138,006.

(30) Foreign Application Priority Data

Apr. 26, 2007 (DE) .......................... 10 2007 019 638

(51) Int. Cl.
 *H01L 29/84* (2006.01)
(52) U.S. Cl.
 USPC .... 257/417; 257/415; 257/774; 257/E29.324; 438/459; 438/460; 438/667
(58) Field of Classification Search
 USPC .......... 257/417, E29.324, 415, 774; 438/460, 438/459, 667
 See application file for complete search history.

(56) References Cited

U.S. PATENT DOCUMENTS

| | | | |
|---|---|---|---|
| 6,727,181 B2* | 4/2004 | Hara .............................. | 438/706 |
| 6,846,725 B2 | 1/2005 | Nagarajan et al. | |
| 7,300,857 B2 | 11/2007 | Akram et al. | |
| 7,326,629 B2* | 2/2008 | Nagarajan et al. ............ | 438/459 |
| 7,553,764 B2* | 6/2009 | MacNamara et al. ......... | 438/667 |
| 2005/0218488 A1* | 10/2005 | Matsuo ......................... | 257/678 |
| 2006/0157808 A1 | 7/2006 | Matsuo | |
| 2007/0099395 A1* | 5/2007 | Sridhar et al. ................ | 438/460 |

FOREIGN PATENT DOCUMENTS

| | | |
|---|---|---|
| EP | 0 316 799 | 5/1989 |
| JP | 2002-110500 | 4/2002 |
| JP | 2005-38884 | 2/2005 |
| JP | 2005-166909 | 6/2005 |
| JP | 2005-294462 | 10/2005 |

* cited by examiner

*Primary Examiner* — Thinh T Nguyen
(74) *Attorney, Agent, or Firm* — Kenyon & Kenyon LLP

(57) ABSTRACT

A method for manufacturing a micromechanical component is proposed. In this context, at least one trench structure having a depth less than the substrate thickness is to be produced in a substrate. In addition, an insulating layer and a filler layer are produced or applied on a first side of the substrate. The filler layer comprises a filler material that substantially fills up the trench structure. A planar first side of the substrate is produced by way of a subsequent planarization within a plane of the filler layer or of the insulating layer or of the substrate. A further planarization of the second side of the substrate is then accomplished. A micromechanical component that is manufactured in accordance with the method is also described.

8 Claims, 5 Drawing Sheets

METHOD FOR PRODUCING A MICROMECHANICAL COMPONENT HAVING A TRENCH STRUCTURE FOR BACKSIDE CONTACT

CROSS-REFERENCE TO RELATED APPLICATIONS

This application is a divisional application of U.S. patent application Ser. No. 12/597,137 filed Oct. 22, 2009 now U.S. Pat. No. 8,138,006, which is the U.S. national phase of International Application No. PCT/EP2008/054233 filed on Apr. 8, 2008, and claims priority to German Patent Application No. 10 2007 019 638.7 filed on Apr. 26, 2007, all of which are hereby incorporated by reference in their entirety.

BACKGROUND OF THE INVENTION

European Patent EP 0 316 799 B1 discusses a method for manufacturing a semiconductor component. In the method, a drain is shaped into a semiconductor crystal layer and into a silicon oxide layer. The drain is the starting point for backside contacting of the semiconductor element thus formed. Manufacturing the drain is, however, very complex and time-intensive.

SUMMARY OF THE INVENTION

The method according to the present invention for manufacturing a micromechanical component having a trench structure for back-side contacting, in accordance with the main claim and the features of the coordinated claims, has, in contrast thereto, the advantage that trench structures can be filled with conductive material in particularly simple and economical fashion, and that back-side contacting is possible in particularly simple and economical fashion by way of a subsequent planarization of the back side of the substrate. In addition, the filler layer that is used to fill the trench structures can also simultaneously be used as a functional layer, if the filler layer is not completely removed by planarization of the front side.

The filler material that is used and that forms the filler layer may be a doped material, and/or regions having a polycrystalline and/or monocrystalline material are produced on the first side of the substrate. Doped polysilicon or epitaxial polysilicon (epi-polysilicon) is usable, for example, as a filler material. The use of doped filler material results, advantageously, in a low electrical resistance within the filled trench structure. Monocrystalline silicon can grow in regions in which the substrate was unprotected prior to epitaxy (i.e. in patterned regions of the insulating layer at least partly removed thereby). Conversely, polycrystalline silicon grows in the context of epitaxy in regions in which the insulating layer was not patterned. Integrated circuits in the micromechanical component are thereby advantageously possible. For example, CMOS circuits can be manufactured by way of the monocrystalline regions.

In further manner, the substrate is planarized on the second side as far as a plane in the trench structure. In another exemplary embodiment, at least one layer is applied and/or produced on the substrate proceeding from the second side. The layer that is produced may be a third insulating layer. Planarization of the second advantageously makes it possible to enable through-contacting of the micromechanical component without needing to perform through-trenching of the substrate in that context.

In particular, the problem of through-trenching of trench structures having different cross sections, with the result that different etching rates are created, can thereby be circumvented. Combinations of trench structures having different widths and geometries are thus also advantageously usable as through-contacting. The third insulating layer on the second side need not be continuous, but may have cutouts or gaps in the region of the through-contacting. This advantageously enables back-side contacting from the second side of the micromechanical component in the region of the filled trench structure.

After planarization of the second side of the substrate, at least one layer may be produced, and/or at least one structure may be applied, onto subregions of the second side of the substrate. For example, a metallization can be applied, in the region of the through-contacting, into the gaps or cutouts of the third insulating layer on the second side of the substrate. The metallization can furthermore, for example, be in contact with solder bumps. Advantageously, a flip-chip connection, for example, can thereby be created between micromechanical and/or integrated components. Also conceivable, however, is the application or production of wiring planes on the second side of the substrate as structures.

Alignment of the layers and/or structures on the second side of the substrate can advantageously be accomplished on the basis of the exposed trench structure. The exposed insulating layer and/or the filler layer in the trench structure exhibits a sufficiently high contrast with respect to the substrate that alignment of the layers and/or structures on the second side of the substrate can be accomplished substantially even without infrared or front-to-back-side alignment.

In further manner, after planarization of the first side of the substrate, at least one mask layer and a second insulating layer is applied onto and/or produced on the first side of the substrate. In another exemplary embodiment, a narrow trench structure is also formed. The mask layer may be a hard mask layer. The hard mask layer may be a silicon oxide layer and/or a photoresist layer, and may be removed by HF gas-phase etching or an oxygen plasma.

A further subject of the exemplary embodiments and/or exemplary methods of the present invention relates to a micromechanical component that is manufactured by way of the method according to the present invention. The micromechanical component has at least one trench structure, the trench depth being substantially equal to the thickness of the micromechanical component. This makes possible back-side contacting of the micromechanical component on the second side of the substrate, through the trench structure.

Advantageously, the result of the manufacturing method according to the present invention is that in the context of the micromechanical component, gap-dependent etching rates during trenching essentially no longer have an influence.

Advantageously, two micromechanical components according to the present invention can also, for example, be connected to one another via a flip-chip connection. The micromechanical components can of course also be integrated, and can nevertheless be connected to one another by way of a flip-chip connection.

The micromechanical component may have a cap wafer, the cap wafer may be connected to the substrate, or to layers on the substrate, by anodic bonding and/or seal-glass bonding. In particular, anodic bonding of the cap wafer ensures a long-lasting connection between the cap wafer and substrate, so that failure of the micromechanical component due to detachment of the cap wafer can be avoided.

The micromechanical component may have a grid and/or a recess and/or a conductive path and/or a circuit region. The grid may be an n-doped silicon grid, and may constitute a diaphragm. The recess may be located on the first side of the substrate, and ends before the diaphragm or before the filler layer. The circuits can be integrated circuits but also resistors or the like.

The micromechanical component may have movable sensor structures and/or regions having monocrystalline material and/or polycrystalline material.

The filler layer may have a doped filler material, the filler material and/or the regions having monocrystalline material and/or polycrystalline material and/or the substrate material being made of silicon and/or of germanium and/or of silicon-germanium.

The micromechanical component may be a sensor, by preference a pressure sensor or an acceleration sensor or a rotation rate sensor.

Exemplary embodiments of the present invention are depicted in the drawings and explained further in the description that follows.

SUMMARY OF THE INVENTION

Figure 1A:
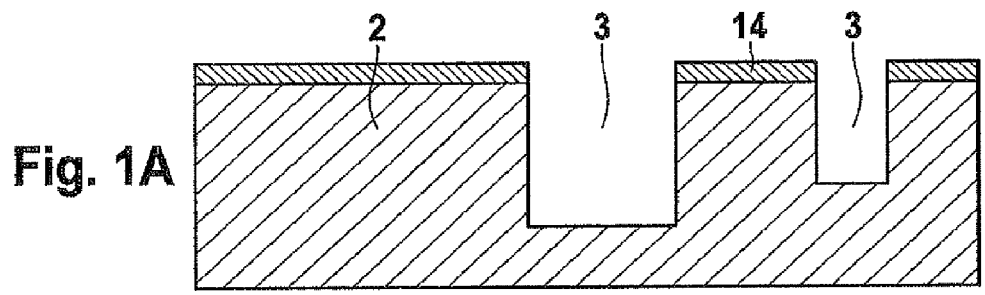
FIGS. 1A, 1B, 1C, 1D, 1E, 1F, 1G, 1H, 1I, 1J, 1K, and 1L schematically depict the steps for manufacturing a micromechanical component having two trench structures.

FIGS. 1A to L schematically depict the manufacture of a micromechanical component 1. Trench structures 3 have been manufactured in a substrate 2 by trenching. Mask layer 14 was applied or produced prior to trenching, so that substrate 2 located therebeneath was protected from the etching medium during the trenching operation (FIG. 1A). The depth of trench structures 3 is dependent on the later thickness of micromechanical component 1, and is selectable substantially without restriction.

Figure 1B:
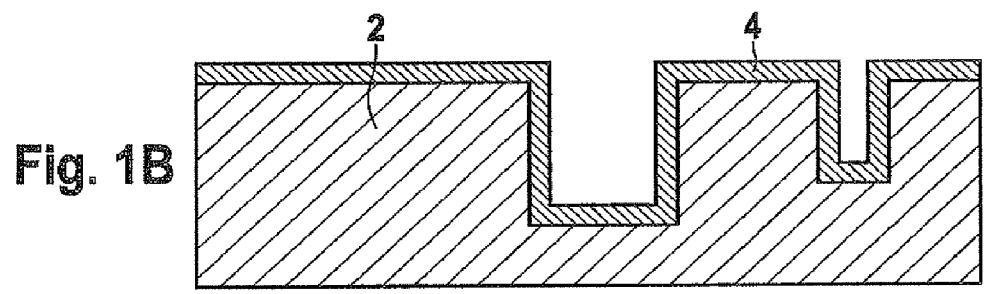
Figure 1C:
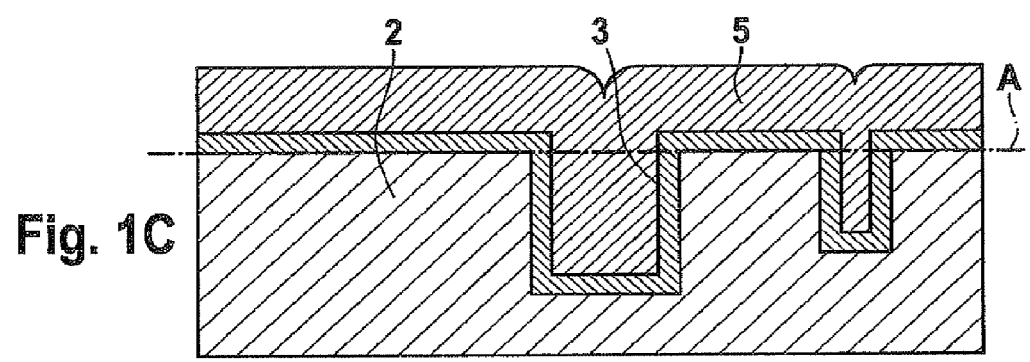
Figure 1D:
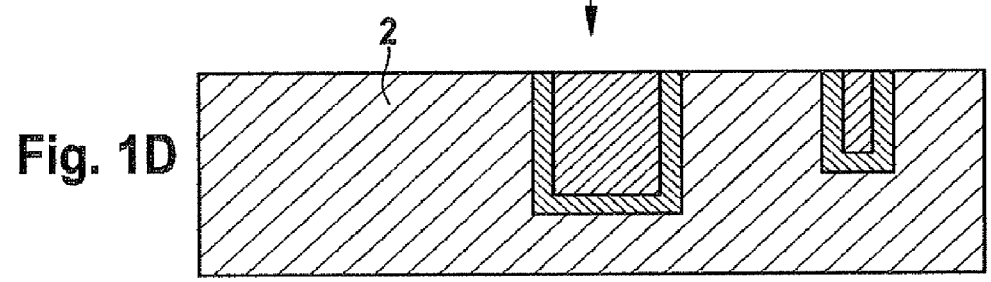
Figure 1E:
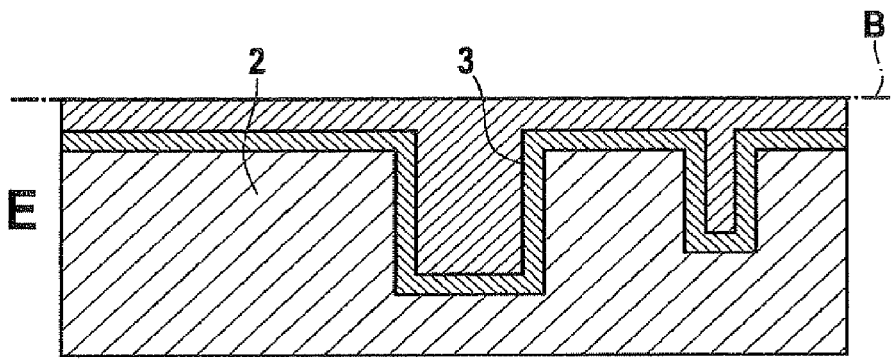

In the exemplary embodiment, trench structures 3 exhibit different depths that result from the different etching rates brought about, for example, by the differing widths of the trench structures. An insulating layer 4 is produced or formed by thermal oxidation or deposition (FIG. 1B). Insulating layer 4 may be made of silicon oxide. A filler layer 5, made for example of doped polysilicon or doped epi-silicon, is then deposited (FIG. 1C). Filler layer 5 also gets into trench structures 3 and seals or fills them. The advantageous result is thereby to create regions for layer through-contacting that can be filled in uncomplicated fashion with filler layer 5, for example in the form of doped material. A variety of planes in which planarization can be performed are depicted in FIGS. 1C and 1E. In FIG. 1C, both filler layer 5 (located above substrate 2) and insulating layer 4 are to be removed as far as line A by planarization.

Figure 1F:
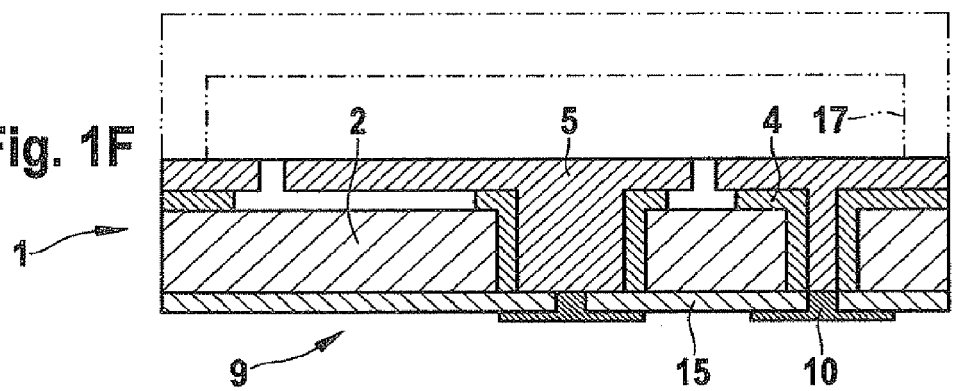

FIG. 1E, on the other hand, depicts (alternatively to the procedure according to FIG. 1C) a removal by way of planarization only as far as line B in filler layer 5. FIG. 1F depicts micromechanical component 1, a second side 9 of substrate 2 having also been planarized. The planarization, also called back-thinning, may be performed as far as the plane of that trench structure which has the least depth.

Through-contacting by way of trench structures 3 is thus advantageously gap-independent. A layer 10 is applied on second side 9 of substrate 2 in the region of trench structures 3, layer 10 being in contact with the filler material in trench structures 3. Layer 10 may be a metallization, for example made of aluminum. Second side 9 of substrate 2 furthermore has a third insulating layer 15. Third insulating layer 15 has, in the region of trench structures 3, recesses into which layer 10 extends.

Figure 1G:
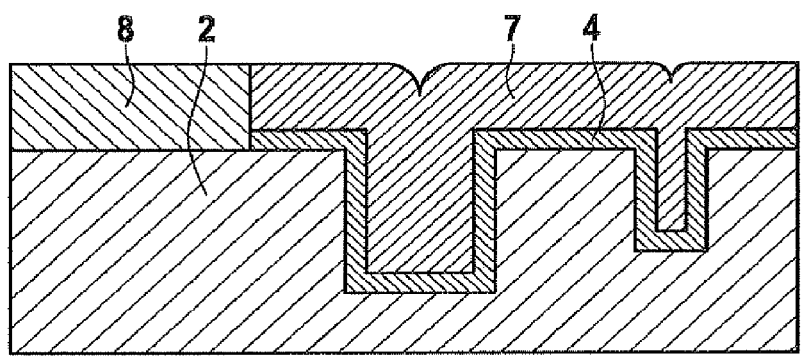

Back-side contacting is made possible by back-thinning into the plane of that trench structure which has the least depth, and of layer 10. Third insulating layer 15 may be made of silicon oxide. A cap wafer 17 is furthermore indicated in FIG. 1F. In FIG. 1G, a region 8 having monocrystalline silicon is grown on substrate 2, prepared e.g. by a LOCOS method. Outside region 8, filler layer 5 is made of polycrystalline silicon, thus creating a region 7 having polycrystalline silicon. Integrated circuits in micromechanical components 1 can also be made possible by regions 7, 8.

Figure 1H:
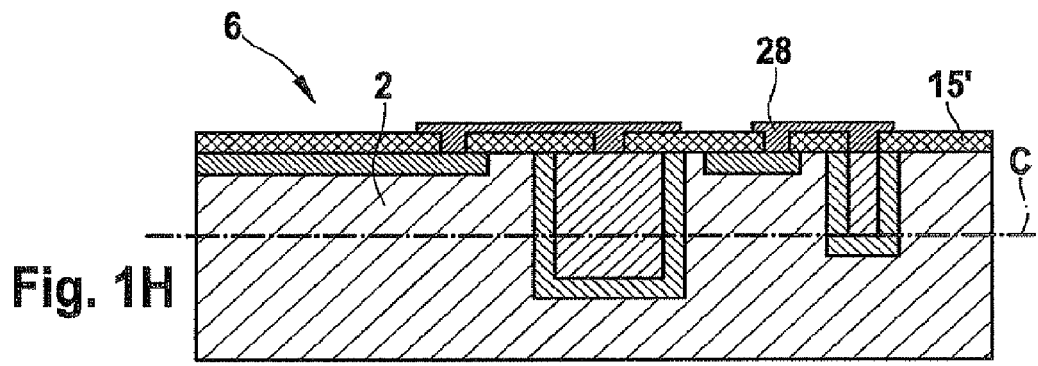
Figure 1I:
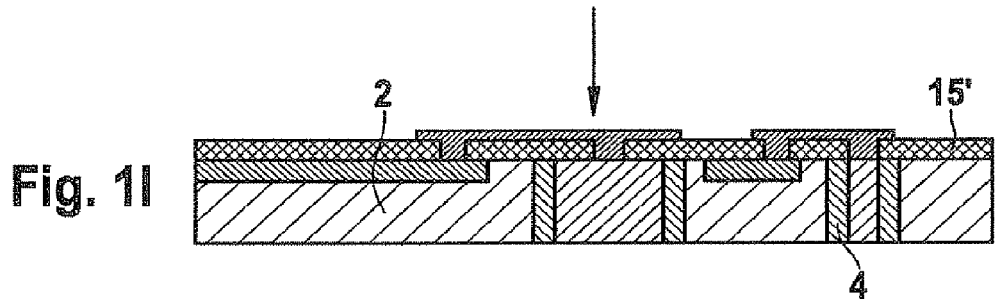
Figure 1J:
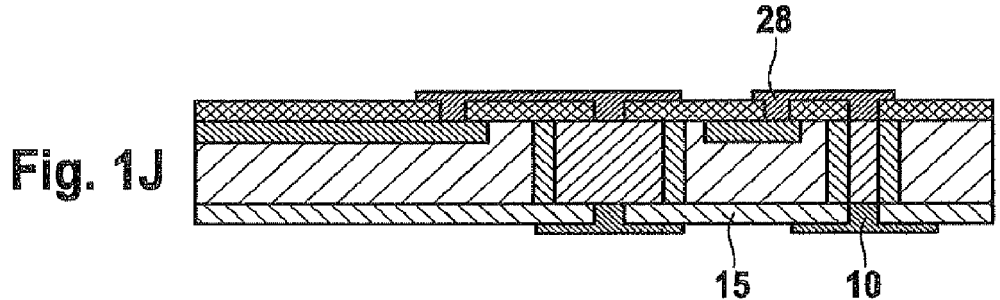

FIGS. 1H to 1J show further embodiments with a different plane for back-thinning of substrate 2 and different configurations of micromechanical component 1. In this context, for example, a second insulating layer 15' is produced on first side 6 of substrate 2, and a further layer 28 is applied (FIG. 1I). Further layer 28 may be made of aluminum and is suitable for electrical contacting (FIG. 1J). Line C indicates the plane in which back-thinning of substrate 2 is to occur.

Figure 1K:
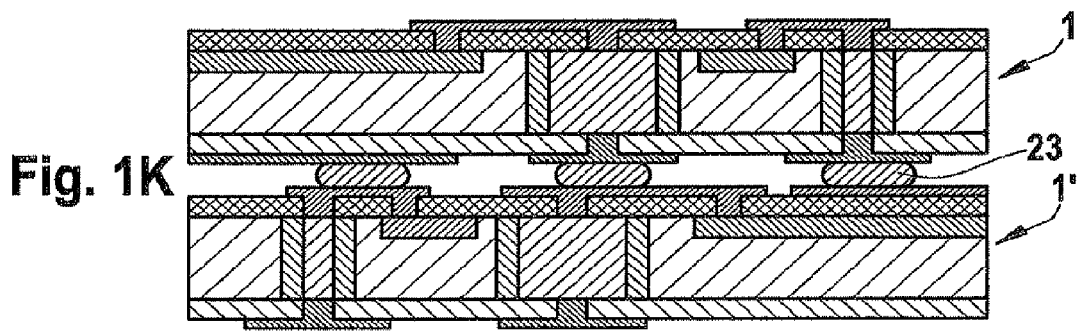
Figure 1L:
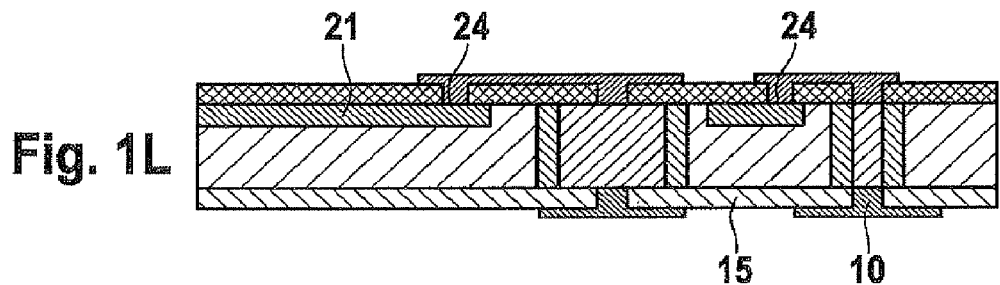

If substrate 2 has on first side 6 and on second side 9, as depicted in FIG. 1J, a metallization in the form of layers 10, 28, the micromechanical component 1 thus formed can be connected to another micromechanical component 1'. FIG. 1K depicts such a connection of two micromechanical components 1, 1', in which contacting of the two micromechanical components 1, 1' occurs, for example, by way of solder bumps 23. FIG. 1L schematically depicts another example of contacting 24 to a circuit region 21.

Figure 2A:
FIGS. 2A, 2B, 2C, 2D, 2E, 2F, 2G, and 2H schematically depict the steps for manufacturing a micromechanical component having a diaphragm.
Figure 2B:
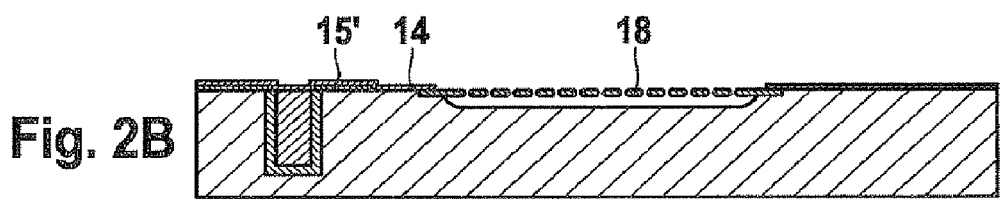
Figure 2C:
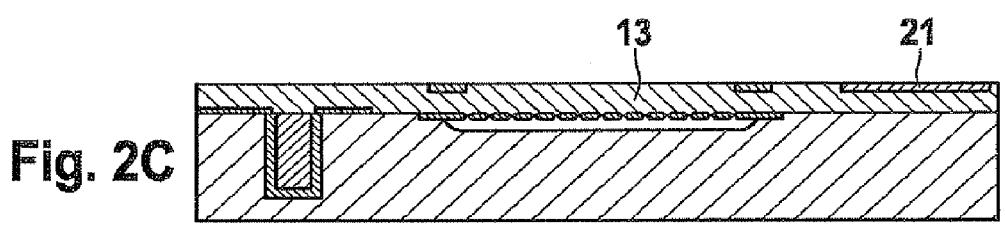
Figure 2D:
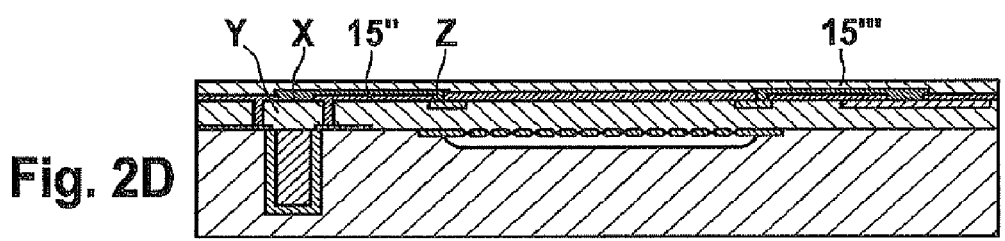

FIGS. 2A to 2F schematically depict the manufacture of a micromechanical component 1 that has a diaphragm in the form of grid 18. In FIG. 2A, substrate 2 already has a trench structure 3 that is filled with filler material, and a planarized surface. A second insulating layer 15' and an etching mask 14, constituting mask layer 14, are applied onto substrate 2 (FIG. 2B). Located below grid 18 may be a cavity that is created, for example, by the rearrangement of porous silicon. Grid 18 may be an n-doped silicon grid. FIG. 2C also depicts a further filler layer 13 into which, for example, circuit regions 21 are introduced. A narrow trench may then be formed, and it is filled with another insulating layer 15" (FIG. 2D). A filled insulating trench is thereby created.

If the insulating trench is embodied in such a way that, in the region above trench structure 3, a lateral, electrically insulated region Y is created inside the conductive further filler layer 13, this region Y can be electrically connected to circuit regions 21 with the aid of a wiring plane Z and corresponding contact holes X in second insulating layer 15'. An electrical connection is thereby obtained between circuit regions 21 and the electrically conductive filler layer 5. A fourth insulating layer 15''' is applied above wiring plane Z.

Figure 2E:
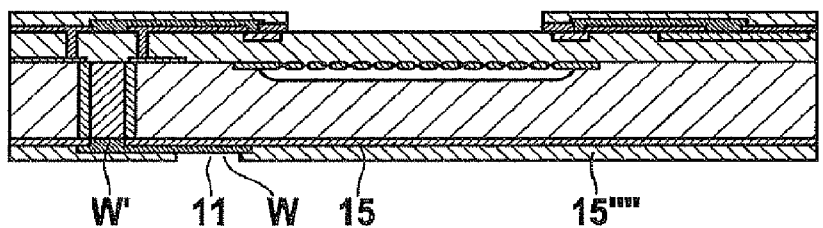
Figure 2F:
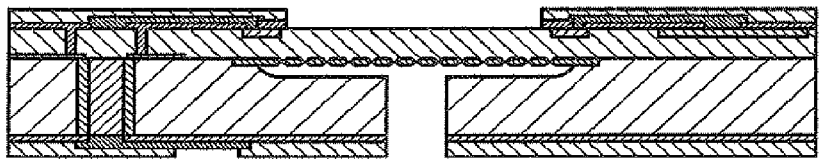
Figure 2G:
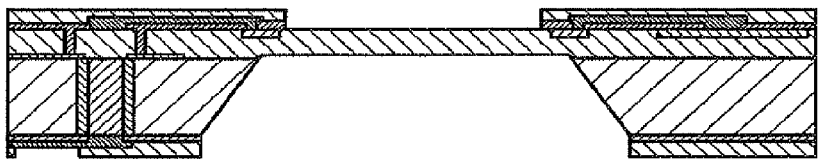
Figure 2H:
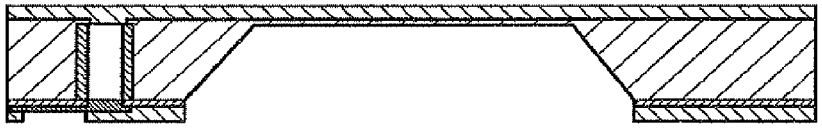

FIGS. 2E to 2F schematically depict exemplifying embodiments for the configuration of second side 9 of substrate 2. For example, a structure 11 can be provided as a wiring plane that is located between two insulating layers 15 and 15''' and that enables, through contact holes W and W', an electrical connection to filler layer 5. Substrate 2 can further have a recess that can be configured in different ways. Examples thereof are depicted in FIGS. 2E to 2H.

What is claimed is:

1. A micromechanical component, comprising:
 a substrate having a first side and a second side;
 at least one trench structure, wherein a filler material substantially fills up the at least one trench structure; and an insulating layer on the first side of the substrate;
wherein a filler layer of a filler material is applied from the first side of the substrate into the at least one trench structure,
wherein there is a planarization within a plane of one of the filler layer and the insulating layer,
wherein there is a further planarization of the substrate from a second side of the substrate,
wherein at least one additional layer is applied onto subregions of the second side of the substrate, the at least one additional layer being in contact with the filler material in each of the at least one trench structure, and
wherein the at least one trench structure is substantially equal to a thickness of the micromechanical component, so that back-side contacting of the micromechanical component on the second side of the substrate is possible.

2. The micromechanical component of claim 1, wherein the micromechanical component has a cap wafer which is at least one of anodically bonded and seal-glass bonded to the substrate.

3. The micromechanical component of claim 1, wherein the micromechanical component has at least one of a grid, a recess, a conductive path, and a circuit region.

4. The micromechanical component of claim 1, wherein the micromechanical component has at least one of: (i) movable sensor structures, and (ii) regions having at least one of a monocrystalline material and a polycrystalline material.

5. The micromechanical component of claim 1, wherein the micromechanical component is one of a pressure sensor, an acceleration sensor, and a rotation rate sensor.

6. The micromechanical component of claim 1, wherein at least one of the filler material of the filler layer, the substrate material, and the regions are made of at least one of silicon, germanium, and silicon-germanium.

7. The micromechanical component of claim 1, wherein at least one of: (a) the substrate is planarized on the second side as far as a plane within the trench structure; and (b) on the second side of the substrate at least one of (1) at least one layer is one of produced and applied, and (2) at least one structure is produced.

8. The micromechanical component of claim 1, wherein at least one of: (a) the substrate is planarized on the second side as far as a plane within the trench structure; and (b) on the second side of the substrate at least one of (1) at least one further insulating layer is one of produced and applied, and (2) at least one structure is produced.

* * * * *